(12) United States Patent
Sharon et al.

(10) Patent No.: US 9,195,537 B2
(45) Date of Patent: Nov. 24, 2015

(54) METHOD OF DATA STORAGE IN NON-VOLATILE MEMORY

(75) Inventors: Eran Sharon, Rishon Lezion (IL); Idan Alrod, Herzliya (IL)

(73) Assignee: SANDISK TECHNOLOGIES INC., Plano, TX (US)

( * ) Notice: Subject to any disclaimer, the term of this patent is extended or adjusted under 35 U.S.C. 154(b) by 69 days.

(21) Appl. No.: 13/390,855

(22) PCT Filed: Mar. 2, 2011

(86) PCT No.: PCT/IB2011/000435
§ 371 (c)(1),
(2), (4) Date: Feb. 16, 2012

(87) PCT Pub. No.: WO2012/117263
PCT Pub. Date: Sep. 7, 2012

(65) Prior Publication Data
US 2012/0278687 A1 Nov. 1, 2012

(51) Int. Cl.
*H03M 13/03* (2006.01)
*G06F 11/10* (2006.01)
(52) U.S. Cl.
CPC .................................. *G06F 11/1048* (2013.01)
(58) Field of Classification Search
CPC ............... G06F 11/10; G06F 11/1048; H03M 13/6362; H03M 13/03; H04L 1/0041; H04L 1/0066; H04L 1/0068; H04L 1/0069; H04L 1/0071
See application file for complete search history.

(56) References Cited

U.S. PATENT DOCUMENTS

2006/0090120 A1* 4/2006 Chen ............................ 714/790
2006/0181934 A1* 8/2006 Shappir et al. ........... 365/185.33
2008/0151618 A1* 6/2008 Sharon et al. ............. 365/185.02
2008/0158948 A1 7/2008 Sharon et al.
2009/0044082 A1* 2/2009 Landau et al. ................ 714/790
2009/0204824 A1* 8/2009 Lin et al. ........................ 713/193
2009/0316490 A1* 12/2009 Takada ..................... 365/185.26
2010/0070681 A1* 3/2010 Wan et al. ..................... 711/103
2010/0074350 A1* 3/2010 Malladi et al. ................ 375/260
2010/0217921 A1* 8/2010 Mun .............................. 711/103
2011/0035539 A1* 2/2011 Honda .......................... 711/103
2011/0107175 A1* 5/2011 Shen et al. .................... 714/752
2011/0176603 A1* 7/2011 Beeler et al. .............. 375/240.02

FOREIGN PATENT DOCUMENTS

WO 2008099958 A1 8/2008

OTHER PUBLICATIONS

International Search Report and Written Opinion mailed Dec. 7, 2011 in International Application No. PCT/IB2011/000435, 11 pages.
International Preliminary Report on Patentability for Application No. PCT/IB2011/000435, issued Sep. 3, 2013, 6 pages.

* cited by examiner

*Primary Examiner* — Sam Rizk
*Assistant Examiner* — Enamul M Kabir
(74) *Attorney, Agent, or Firm* — Toler Law Group, PC

(57) ABSTRACT

A method of storing a set of metadata bits associated with each of multiple data words includes combining the set of metadata bits with each of the multiple data words to generate multiple extended data words. The method includes encoding each of the multiple extended data words to generate multiple codewords and puncturing each of the multiple codewords to generate multiple punctured codewords, where in each of the punctured codewords the set of metadata bits is removed. The method includes storing the multiple punctured codewords, transforming the set of metadata bits to generate a set of transformed metadata bits, and storing the set of transformed metadata bits.

34 Claims, 9 Drawing Sheets

METHOD OF DATA STORAGE IN NON-VOLATILE MEMORY

FIELD OF THE DISCLOSURE

The present disclosure is generally related to storing of data in a non-volatile memory.

BACKGROUND

When storing data in a flash memory system, the data can be stored so that the data appears to be random with a uniform distribution. Randomization of stored data may be advantageous to avoid a correlation between data on adjacent word lines or between data on adjacent bit lines. For example, data to be stored in a non-volatile memory may be scrambled in order to avoid creating a correlation between data on adjacent word lines and in order to avoid a correlation between data on adjacent bit lines of the non-volatile memory. Data that has been scrambled prior to storage can be de-scrambled upon retrieval.

Scrambling of data can be performed by generating a string of bits that can be used as a pseudo-random scrambling word, such as a string of random bits, and then performing an exclusive-OR (XOR) operation of the data with the pseudo-random scrambling word to generate scrambled data. For example, the pseudo-random scrambling word can be generated by applying a seed to a pseudo-random bit generator. The seed may also be used to re-create the pseudo-random scrambling word to descramble the scrambled data. However, storage of the pseudo-random scrambling word or the seed with the data can result in inefficiencies in use of storage space within the non-volatile memory.

Typically, a programming unit of the flash memory system is a page. The page typically has a size of 16 kilobytes (KB). Scrambling of the data stored in the flash memory system may be done on a page level in order to avoid data-dependent errors. However, during a read operation it may be desirable to retrieve data in increments smaller than one page. For example, a host may request to retrieve a small amount of data, such as a single sector of 512 B, and although within the flash memory system an entire page of 16 kB may be read, it may be inefficient to transfer and decode the entire page. Instead, it may be preferable to encode the data of the page within several smaller codewords so that during a read of the flash memory system it is possible to transfer and decode only a single codeword that includes the requested data, the codeword having a size such as 0.5 KB, 1 KB, or 2 KB.

This leads to two competing factors in seed storage and protection. On the one hand, since scrambling may be required on a page level, it would be desirable to have a single scrambling seed stored (reliably with error correction coding (ECC) protection) per page in order to avoid wasting storage area. On the other hand, in order to allow efficient reading of a small amount of data, it would be desirable to retrieve an error-free version of the seed with each codeword in order to descramble the data after decoding.

SUMMARY

A method of storing data includes combining a set of metadata bits, such as a scrambling seed, with each of multiple data words to generate multiple extended data words and encoding the extended data words to produce multiple codewords. After encoding, one or more of the codewords are punctured and the set of metadata bits is removed from each punctured codeword to be stored. Data can be retrieved by reading the metadata bits and one or more punctured codewords from storage, combining the metadata bits with each punctured codeword to generate extended codeword representations, and decoding each extended codeword representation. Advantages of the method include use of a single codeword decode operation that saves time as compared to storing metadata bits in a separate codeword. An additional advantage includes a reduced amount of redundant data stored in memory compact design that avoids requiring a separate, dedicated encoder and decoder for the scrambling seed.

DETAILED DESCRIPTION

One method of storing a scrambling seed and data is to store a single seed for multiple codewords and to protect this seed separately using its own ECC. The disadvantages of this solution are that 1) a separate ECC core is needed for the seed, resulting in higher controller complexity; 2) retrieving the data requires two separate decode operations—one for the data and one for the seed, resulting in longer decoding time; 3) the seed ECC is very short, e.g. the seed may only include four bytes, and hence the ECC is not efficient because much more redundancy is required for protecting the seed, resulting in a waste of storage area.

An improved method proposed herein enables storing a single scrambling seed per page, to avoid wasting storage area, and retrieval of an error-free version of the seed with each codeword in order to descramble the data after decoding. The method also provides a more efficient solution in terms of complexity, decoding time and storage space. A common seed may be used for scrambling each of the codewords. (Alternatively, each codeword may be scrambled by a different seed that is generated from the common seed.) The common seed may be concatenated to each of the data words and encoding may be performed such that computed parity bits protect both the common seed and the data. Prior to programming, the common seed may be removed by puncturing each of the codewords and the punctured codewords may be stored in the flash memory system together with a single instance of the common seed. During a read of a stored codeword, the common seed may be concatenated to the requested codeword. Decoding may be performed to recover an error-free version of the common seed and data. A common seed may be used to descramble the data, retrieving the original user data. Advantages to the method may include 1) use of a single ECC core, reducing complexity; 2) a single decoding operation to retrieve the data, resulting in reduced decoding latency; and 3) less redundancy required to protect the data and the seed because they are both protected using a single long codeword, resulting in higher storage efficiency.

Figure 1:
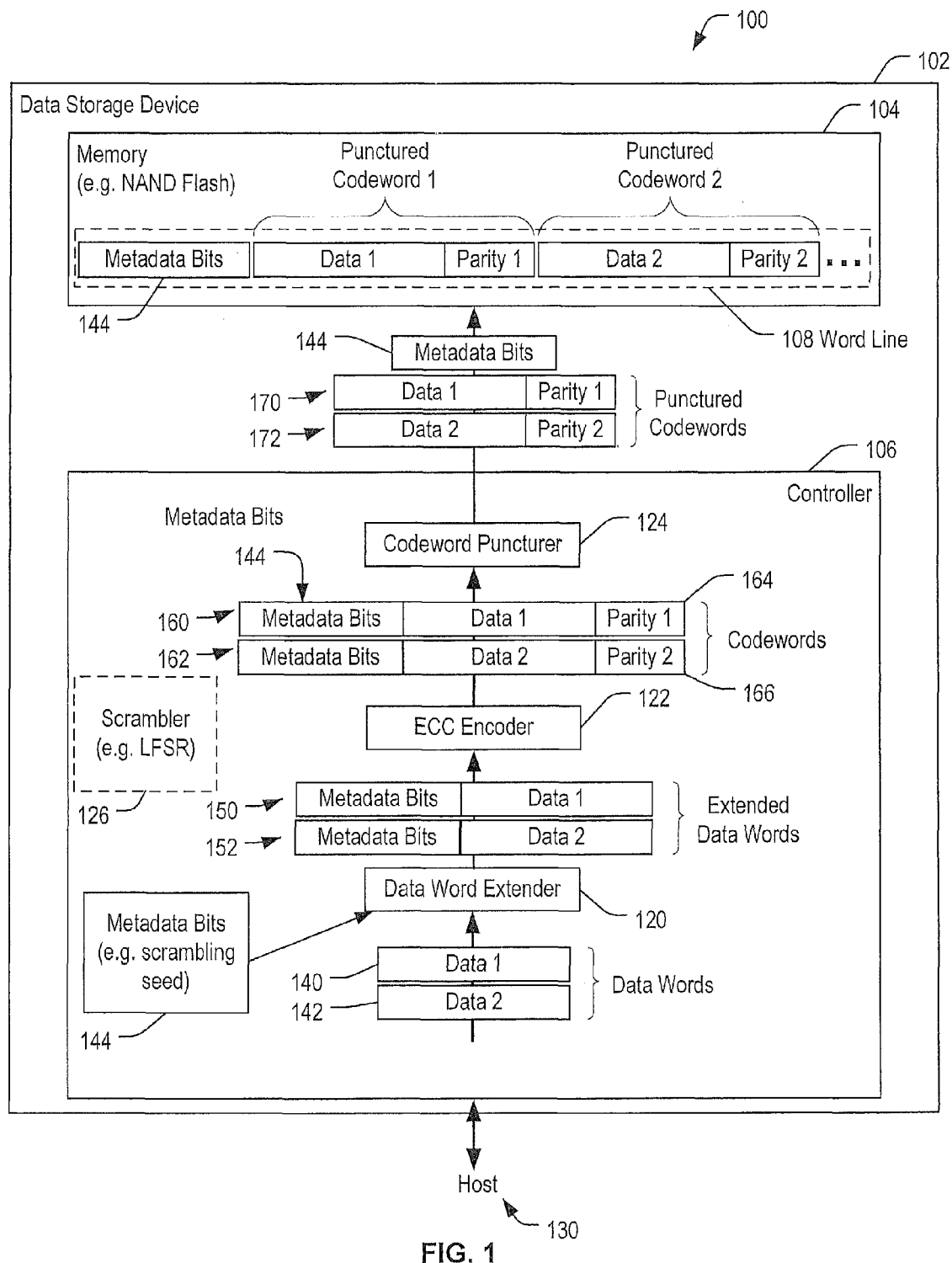
FIG. 1 is a diagram of a first embodiment of a system including a data storage device configured to store data.

FIG. 1 depicts a system 100 including a data storage device 102 that is operatively coupleable to a host device 130. The data storage device 102 includes a memory 104 and a controller 106. The memory 104 may include a plurality of data storage elements (not shown) that may form a plurality of word lines, such as a word line 108. The controller 106 may include a data word extender 120, an error correction code (ECC) encoder 122, a codeword puncturer 124, and optionally, a scrambler 126. The data storage device 102 is configured to accept a plurality of data words and to combine a set of metadata bits 144 with each of the plurality of data words to generate a plurality of extended data words. In some embodiments, metadata bits include information bits, such as a scrambling seed. The data storage device 102 is configured to encode each of the plurality of extended data words to generate a plurality of codewords each of which includes the metadata bits 144, a data word, and parity bits. The data storage device 102 is configured to puncture one or more codewords of the plurality of codewords to generate a plurality of punctured codewords, such as the punctured codewords 170 and 172, by removing the metadata bits 144 from each codeword, and to store the plurality of punctured codewords including the punctured codewords 170 and 172. An advantage of the data storage device 102 is that the metadata bits 144 associated with multiple data words can be stored in a single instance, resulting in a saving of memory space.

The host device 130 may be a device that is configured to be operatively coupled to the data storage device 102, such as a mobile telephone, a music or video player, a personal digital assistant (PDA), a gaming device, an electronic-book reader, a camera, a computer (such as a laptop or notebook computer), any other electronic device, or any combination thereof. The host device 130 is configured to send data to the data storage device 102.

The data storage device 102 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 102 may be embedded memory in the host device 130, such as eMMC® (trademark of JEDEC Solid State Technology Association, Arlington, Va.) and eSD, as illustrative examples.

The memory 104 may be a non-volatile memory or other storage device configured to store data. The memory 104 is configured to receive punctured codewords 170 and 172 and metadata bits 144 and to store the metadata bits 144 and the punctured codewords 170 and 172.

The controller 106 is configured to control an interface to the host device 130 and to perform management of the memory 104. The controller 106 includes a data word extender 120, an error correction code (ECC) encoder 122, and a codeword puncturer 124. The controller 106 is configured to receive data words, such as data words received by the data storage device 102 from the host device 130, and to combine the data words with a set of metadata bits to form extended data words. The controller 106 is also configured to encode the extended data words by using the ECC encoder 122. In an illustrative example, data words received from the host 130 (e.g. data words 140 and 142) may be scrambled by a scrambler 126 before the data words are encoded. The scrambler 126 may scramble each data word based on a seed that is a function of a set of metadata bits 144. Alternatively, the scrambler 126 may scramble each data word based on the set of metadata bits 144 that can include a common seed, or the scrambler 126 may scramble each data word based on the set of metadata bits 144 that can be used as a common seed. The scrambler 126 may include a linear feed back shift register (LFSR) to generate a pseudo random scrambling word to scramble the data words 140 and 142.

The data word extender 120 is configured to receive data words and to combine the set of metadata bits 144 with each received data word to form extended data words. For example, the data word extender 120 can receive the first data word 140 and combine the set of metadata bits 144 with the first data word 140 to produce a first extended data word 150. The data word extender 120 can receive the second data word 142 and combine the set of metadata bits 144 with the second data word 142 to produce a second extended data word 152. The data word extender 120 is configured to output the extended data words to the ECC encoder 122. In a particular example, the controller 106 is operative to apply a particular transformation to one or more of the extended data words prior to inputting the one or more of the extended data words to the ECC encoder 122. For example, the particular transformation can be a function of the set of metadata bits 144. In one example, the particular transformation is a scrambling transformation. The particular transformation may be applied by the scrambler 126. A second example is a "shaping" transformation in which a data sequence having 50% zeros is transformed into a "shaped" data sequence having less than 50% zeros, e.g. only 30% zeros. The metadata may serve as a mapping table for the shaping transformation. The shaping transformation applied to data produces a sequence with a smaller percentage of zeros that may result in less wear of the flash memory system and may enhance its endurance, allowing for more write/erase cycles. In a third example, the metadata may be used by flash management algorithms to associate certain attributes to data of a word line. In the third example, a data word extender (such as the data word extender 120) does not transform the data, but instead concatenates the metadata to the data.

The ECC encoder 122 is configured to receive the extended data words from the data word extender 120 and to encode each extended data word. For example, the ECC encoder 122 may encode an extended data word using Bose-Chaudhuri-Hocquenghem (BCH) encoding, Reed-Solomon encoding, low density parity check (LDPC) encoding, or using another type of coding. The ECC encoder 122 is configured to output codewords, each codeword including metadata bits 144, a data word, and parity bits corresponding to the extended data word. For example, the ECC encoder 122 is configured to output a first codeword 160 that includes the metadata bits 144, the first data word 140, and first parity bits 164 that are associated with the first extended data word 150. As a further example, the ECC encoder 122 is configured to output a second codeword 162 that includes the metadata bits 144, the second data word 142, and second parity bits 166 associated with the second extended data word 152.

In another illustrative example, the metadata bits 144 may be encoded by a second ECC encoder (not shown) according to an encoding scheme that may differ from the encoding scheme of the ECC encoder 122 to generate encoded (i.e., transformed) metadata bits. After the metadata bits are encoded to form transformed (i.e., encoded) metadata bits by the second ECC encoder, the encoded metadata bits can be stored at the memory 104. The second ECC encoder may be a dedicated ECC that adds extra protection to the metadata bits to enable the metadata bits to be stored independent of the punctured codewords 170, 172.

The codeword puncturer 124 is operative to receive codewords that have been output from the ECC encoder 122 and to puncture one or more of the received codewords to remove selected data bits from the codeword. For example, the codeword puncturer 124 may be operative to puncture each received codeword to remove redundant metadata bits. In an example, each of the received codewords includes the metadata bits 144 and the codeword puncturer 124 removes the metadata bits 144 from each received codeword. The codeword puncturer 124 may be configured to output punctured codewords that include data and parity bits, but do not include the metadata bits. For example, the codeword puncturer 124 may be operative to puncture the first codeword 160 to remove the metadata bits 144 from the first codeword 160 to output a first punctured codeword 170 that includes the first data word 140 and the first parity bits 164. As another example, the codeword puncturer 124 is operative to puncture the second codeword 162 to remove the metadata bits 144 to output a second punctured codeword 172 that includes the second data word 142 and the second parity bits 166. In a particular embodiment, the codeword puncturer 124 is also operative to output the metadata bits 144 separately from the punctured codewords 170 and 172.

In a particular illustrative example all of the codewords except for one codeword may be punctured. In this case, the metadata bits 144 may be included in the non-punctured codeword that is to be stored in the memory 104. As a result, the metadata bits 144 are stored a single time, rather than being stored multiple times in the memory 104. For example, the word line 108 includes a single copy of the metadata bits 144 and multiple punctured codewords.

During operation, the data word extender 120 may receive data words (e.g. the first data word 140 and the second data word 142) and may receive the set of metadata bits 144, such as a scrambling seed. In an example, prior to receipt by the data word extender 120, the data words 140 and 142 have been scrambled by the data scrambler 126 using a scrambling seed that is based on the metadata bits 144. The data word extender 120 may output extended data words, such as the first extended data word 150 and the second extended data word 152. The first extended data word 150 may include the first data word 140 and the metadata bits 144. The second extended data word 152 may include the second data word 142 and the metadata bits 144.

The first extended data word 150 and the second extended data word 152 may be input into the ECC encoder 122, The ECC encoder 122 may output codewords, such as a first codeword 160 and a second codeword 162. The first codeword 160 may include the metadata bits 144, the first data word 140, and the first parity bits 164. The second codeword 162 may include the metadata bits 144, the second data word 142, and the second parity bits 166. In a particular illustrative example, the code used by the ECC encoder 122 is a systematic code.

The first codeword 160 and the second codeword 162 that are output by the ECC encoder 122 may be input to the codeword puncturer 124. Upon performing a puncturing operation, the output of the codeword puncturer 124 may include the first punctured codeword 170, the second punctured codeword 172, and the metadata bits 144 that have been removed from the first codeword 160 and from the second codeword 162. The first punctured codeword 170 may include the first data word 140 and the first parity bits 164, but does not include the metadata bits 144. The second punctured codeword 172 may include the data of the second data word 142 and the second parity bits 166, but does not include the metadata bits 144. The first punctured codeword 170 and the second punctured codeword 172 may be stored in the memory 104 (e.g., in the word line 108.)

The illustrated implementation of the controller 106 concatenates a set of metadata bits with each data word. For example, the metadata bits 144 are combined with the first data word 140 to generate the first extended data word 150, and the metadata bits 144 are combined with the second data word 142 to generate the second extended data word 152. Data words may be scrambled prior to encoding by the ECC encoder 122. In a particular illustration, each of the data words 140 and 142 are scrambled by the scrambler 126 prior to being stored at the memory 104. For example, each of the data words 140, 142 may be input to the scrambler 126 and a pseudo random scramble word may be applied to each of the data words 140, 142. In an example, each data word may be scrambled according to different scrambling words resulting from different seeds. The seeds may be generated by a predefined transformation of a common seed, such as the metadata bits 144. Generation of a seed for a particular data word from the common seed may be dependent upon a storage location to which the data word is to be stored in the memory 104. In a particular example, a transformation may be applied to the common seed to generate the seed for a particular data word. The transformation may include a bit shift or rotation, such as a zero bit shift for a first location, a one bit shift for a second location, or another transformation.

The scrambled output is then sent to the data word extender 120. For each data word, such as the first data word 140 and the second data word 142, the controller 106 may generate an extended data word, such as the extended data words 150 and 152. Each extended data word may be encoded by the error correction code (ECC) encoder 122 to produce multiple codewords, such as the codewords 160 and 162. Each codeword may include the metadata bits 144, a data word (e.g., the first data word 140 or the second data word 142), and parity bits (e.g., the first parity bits 164 or the second parity bits 166).

Figure 2:
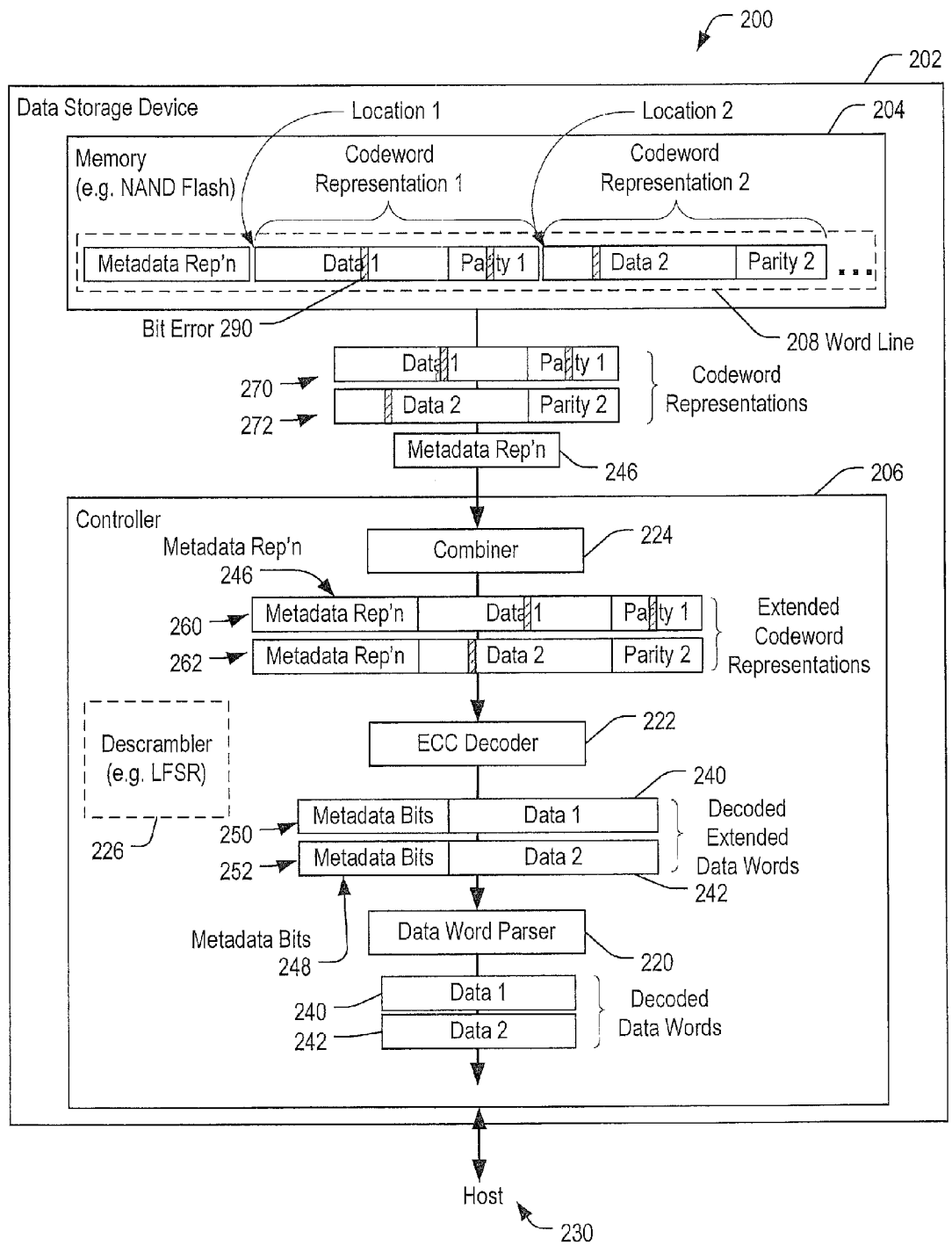
FIG. 2 is a diagram of a second embodiment of a system including a data storage device configured to provide data to a host.

FIG. 2 depicts a system 200 to retrieve stored data and includes a data storage device 202 that is coupled to a host device 230. The data storage device 202 includes a memory 204 and a controller 206. The data storage device 202 is configured to store a plurality of codeword representations of codewords and a metadata representation of a set of metadata bits at the memory 204 and to read the stored codeword representations and the metadata representation from the memory 204. The data storage device 202 is also configured to combine the metadata representation with each of the plurality of codeword representations to generate a plurality of extended codeword representations, to decode each of the extended codeword representations to generate a plurality of decoded extended data words, and to parse the decoded extended data words to generate a plurality of decoded data words. The data storage device 202 may correspond to the data storage device 102 of FIG. 1.

The host device 230 may be a device that is configured to be operatively coupled to the data storage device 202, such as a mobile telephone, a music or video player, a personal digital assistant (PDA), a gaming device, an electronic-book reader, a camera, a computer (such as a laptop or notebook computer), any other electronic device, or any combination thereof. The host device 230 is configured to send data to the data storage device 202.

The data storage device 202 includes a controller 206 configured to control an interface to the host device 230 and to perform management of the memory 204. For example, the data storage device 202 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 202 may be embedded memory in the host device 230, such as eMMC® (trademark of JEDEC Solid State Technology Association, Arlington, Va.) and eSD, as illustrative examples. The memory 204 may be a non-volatile memory or other storage device configured to store data. The memory 204 may be configured to store metadata bits and one or more codeword representations, such as at a representative word line 208. For example, a first codeword representation 270 may be stored at a first location of a word line 208 and a second codeword representation 272 may be stored at a second location of the word line 208. The memory 204 may include a plurality of word lines including the word line 208.

The data storage device 202 is configured to read the stored codeword representations, such as codeword representations 270 and 272, from the memory 204 and to read the representation of metadata bits, such as a metadata representation 246, from the memory 204. In a particular example, the data storage device 202 is configured to decode the metadata bit representation 246 to generate a set of decoded (i.e., transformed) metadata bits (not shown). For example, the data storage device 202 may decode the metadata representation 246 by, e.g., a dedicated ECC decoder (not shown) that decodes only the metadata representation 246. As a particular illustrative example, the transformation of the metadata bits is an identity transformation and in this case, the set of transformed metadata bits is identical to the set of metadata bits.

The controller 206 may include a combiner 224, an error correction code (ECC) decoder 222, and a data word parser 220. The controller 206 is an apparatus configured to receive codeword representations, such as the codeword representations 270 and 272, and to receive a metadata representation, such as the metadata representation 246.

The combiner 224 is configured to combine the codeword representations with the metadata bits to generate extended codeword representations. For example, the combiner 224 can combine the codeword representations 270 and 272 with the metadata representation 246 to generate extended codeword representations 260 and 262.

The ECC decoder 222 is configured to decode the extended codeword representations, using an error correction code (ECC), to generate decoded extended data words. For example, the ECC decoder 222 can decode the extended codeword representations 260 and 262 to generate decoded extended data words 250 and 252.

The data word parser 220 is configured to parse the decoded extended data words to generate decoded data words. For example, the data word parser 220 can parse the decoded extended data words 250 and 252 by removing the decoded set of metadata bits 248 to generate decoded data words 240 and 242.

The controller 206 may include a descrambler 226 that is configured to descramble data using the set of metadata bits 248. For example, the set of metadata bits 248 may be a seed that was used to scramble the data prior to storing the data at the memory 204. In a particular example, ECC decoding and descrambling are performed on the extended word representations to produce the decoded extended data words, such as the decoded extended data words 250 and 252. In a particular embodiment, the descrambling is performed as part of the decoding process.

During operation, the first codeword representation 270 and the second codeword representation 272 may be retrieved from the memory 204 by the controller 206. The first codeword representation 270 may include a representative bit error 290. One or more bit errors such as the bit error 290 can be included in a portion of a codeword representation and/or within parity bits of the codeword representation and/or within the metadata representation 246. As shown in FIG. 2, the codeword representation 270 includes a data bit error and a parity bit error, and the codeword representation 272 includes a data bit error.

Additionally, a representation of metadata bits may be retrieved from the word line 208 of the memory 204. For example, the data word representations 270 and 272 and the metadata representation 246 may be retrieved from the word line 208 of the memory 204.

The controller 206 may input the data word representations 270, 272 and the metadata representation 246 to the combiner 224. The combiner 224 may output the extended data word representations 260 and 262. The first extended codeword representation 260 may include the metadata representation 246 and the first codeword representation 270. The second extended codeword representation 262 may include the metadata representation 246 and the second codeword representation 272.

The extended codeword representations 260 and 262 may be input to the ECC decoder 222. The ECC decoder 222 may output decoded extended data words 250 and 252. The first decoded extended data word 250 may include metadata bits 248 and first data 240. The second decoded extended data word 252 may include the metadata bits 248 and second data 242. The decoded extended data words 250 and 252 may be input into the data word parser 220. The data word parser 220 may output decoded data words 240 and 242. The decoded data words 240 and 242 may be descrambled by the descrambler 226 based on the metadata bits 248, such as described with respect to FIGS. 5-8. In a particular embodiment, a particular metadata representation that is corrected during decoding of one of the codewords to produce metadata bits, such as metadata bits 248, may be used when decoding other codewords. For example, the metadata representation 246, when corrected via ECC decoder 222 during decoding of the first extended codeword representation 260, may produce the metadata bits 248. The metadata bits 248 may be used instead of the metadata representation 246 to form the second extended codeword representation 262. As a result, the second extended codeword representation 262 may have fewer errors, increasing a probability of success and reducing decoding time.

An advantage of the data storage device 202 is that metadata bits that are stored in a single instance in a memory of the data storage device 202 and that are associated with multiple data words can be retrieved and combined with each of the multiple data words, resulting in a saving of memory space. In addition, the data storage device 202 may reduce data read latency as compared to a device that encodes the metadata bits multiple times or encodes the metadata bits using a separate ECC. Further, the data storage device 202 may require lesser redundancy to protect the data and the seed because both the data and the seed are protected using a single long codeword, resulting in higher storage efficiency.

Figure 3:
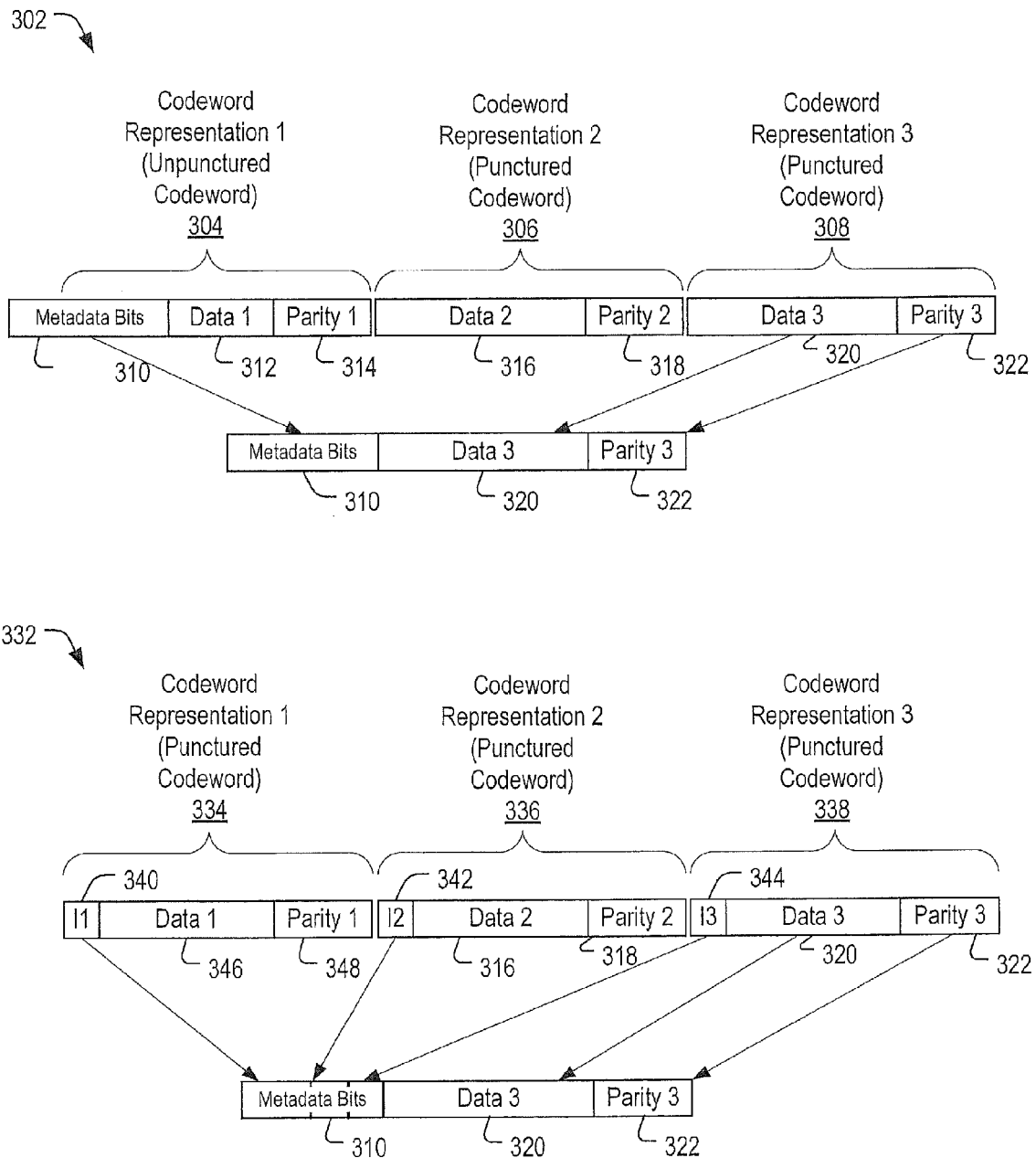
FIG. 3 is a diagram of a particular embodiment of codeword representations including common metadata bits stored at a data storage device.

FIG. 3 depicts two sets of codeword representations. Set 302 includes a first codeword representation 304, a second codeword representation 306, and a third codeword representation 308. The first codeword representation 304 includes metadata bits 310, first data 312, and first parity bits 314. The second codeword representation 306 includes second data 316 and second parity bits 318. The second codeword representation 306 does not include the metadata bits 310. The third codeword representation 308 includes third data 320 and third parity bits 322. The third codeword representation 308 does not include the metadata bits 310.

The metadata bits 310 stored in the first codeword representation 304 can be combined with the third codeword representation 308. A resulting extended codeword representation includes the metadata bits 310, the third data 320, and the third parity bits 322. An advantage to storing the metadata bits 310 in only the codeword representation 304 is a potential saving of memory space. For example, when each of the codeword representations 304, 306, and 308 is associated with the metadata bits 310, storage of the metadata bits 310 with only one of the codeword representations results in a saving of memory space.

FIG. 3 also depicts a codeword set 332 including a first codeword representation 334, a second codeword representation 336, and a third codeword representation 338. The first codeword representation 334 includes metadata bits 340. For example, the metadata bits 340 can be a first portion of a total set of metadata bits such as the metadata bits 310. The second codeword representation 336 can include a second set of metadata bits 342 that can be a second portion of the metadata bits 310. The third codeword representation 338 can include a third set of metadata bits 344 that can be a third portion of the metadata bits 310. The first codeword representation 334 can include the first portion 340 of the metadata bits 310, first data 346, and first parity bits 348. The second codeword representation 336 can include the second portion 342 of the metadata bits 310, the second data 316, and second parity bits 318. The third codeword representation 338 can include the third portion 344 of the metadata bits 310, third data 320, and third parity bits 322. In an example, the portions 340, 342, and 344 can be combined to produce the metadata bits 310, and the metadata bits 310 can be concatenated with any one or more of the representations, such as with the third data 320 and the third parity bits 322.

An advantage to distributing storage of the metadata bits 310 among a plurality of codeword representations such as codeword representations 334, 336, and 338 is a potential saving of memory space. For example, when each of the codeword representations 304, 306, and 308 is associated with the same metadata bits 310 and when all bits of the set of metadata bits 310 are distributed in storage so that the set of metadata bits 310 is stored only once, a saving of storage space in the memory can result. In addition, each of the codeword representations 334, 336, and 338 may be equally sized and may contain equal amounts of data, as compared to the codeword representations 304, 306, and 308. As a result, ECC processing may be simplified.

Figure 4:
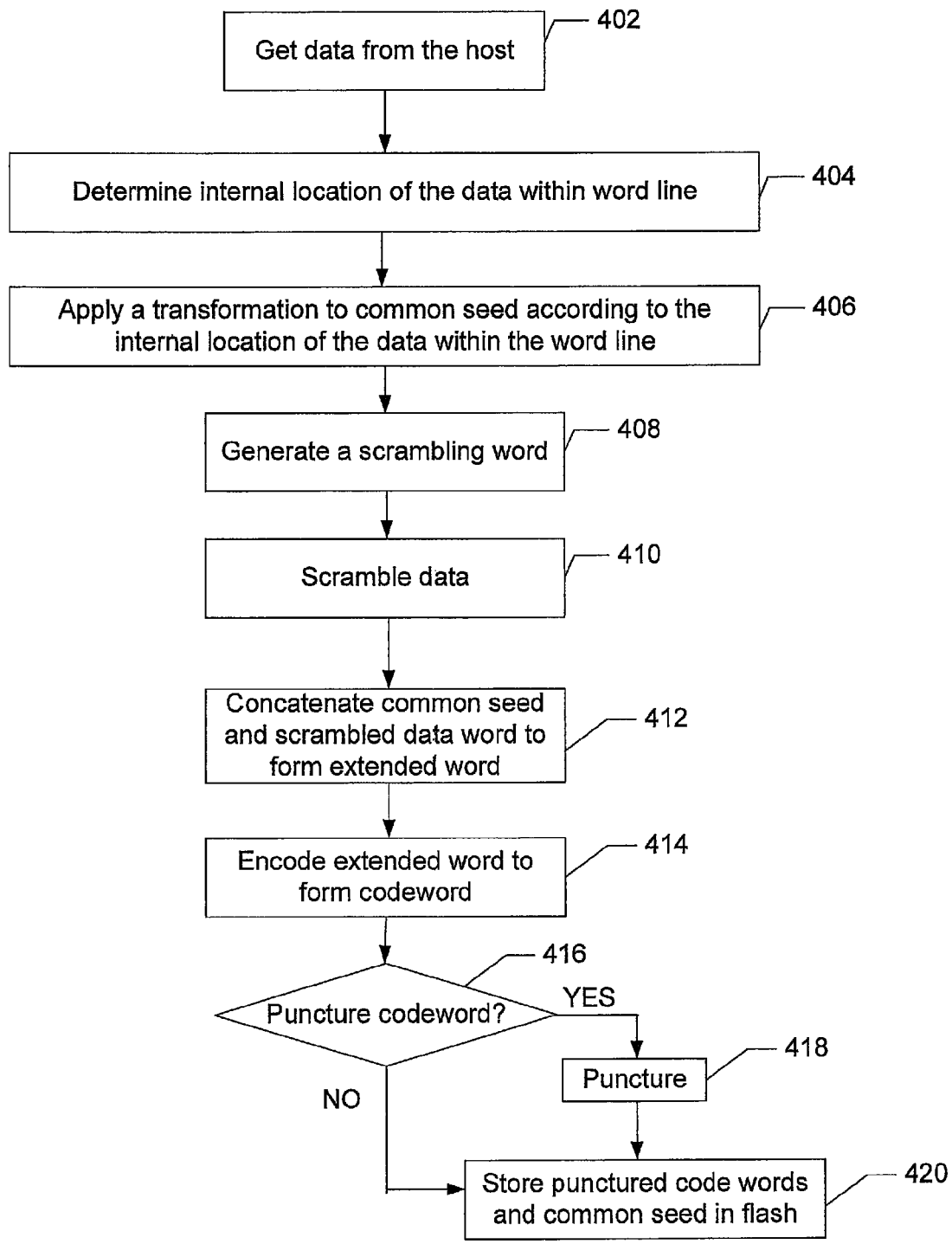
FIG. 4 is a flow chart depicting a first embodiment of a method of storing data in a memory.

FIG. 4 depicts a flow chart corresponding to a particular embodiment of a method of storing data. Referring to FIG. 4, at 402, data may be retrieved from a host. For example, the data storage device 102 of FIG. 1 may retrieve the data from the host device 130.

Proceeding to 404, an internal location of the data within a word line of the memory storage device may be determined. For example, referring to FIG. 1, one of a plurality of internal locations of a word line 108 may be determined within the memory 104 of the data storage device 102.

Proceeding to 406, a transformation may be applied to a common seed according to the internal location of the data within the word line. For example, referring to FIG. 1, a transformation may be applied to the set of metadata bits 144 to form a transformed set of metadata bits (not shown). The transformation may be dependant upon an internal location of data to be stored in a word line such as the word line 108 of the memory 104.

Continuing to 408, a scrambling word may be generated. For example, the scrambling word may be generated using the transformed seed, such as the transformed set of metadata bits. The transformed seed based on location may generate a distinct scrambling word for each of the codewords (e.g., ECC pages) that are to be stored to memory. Use of the distinct scrambling word reduces possible data correlation between the scrambled data.

Moving to 410, the data may be scrambled using the scrambling word. For example, in FIG. 1, the scrambler 126 may scramble the data using the scrambling word. The scrambler 126 may include a linear feedback shift register to scramble the data by using the transformed seed to generate the scrambling word and applying an XOR of the data and the scrambling word.

Advancing to 412, the common seed may be concatenated with the scrambled data word to form an extended data word. For example, in FIG. 1, the common seed may be the set of metadata bits 144. The first data word 140 may be concatenated with the set of metadata bits 144 to form the first extended data word 150, and a second data word 142 may be concatenated with the set of metadata bits 144 to form the second extended data word 152.

Continuing to 414, the extended word may be encoded to form a codeword. For example, in FIG. 1, extended data words 150 and 152 may be encoded by the ECC encoder 122 to form codewords 160 and 162, respectively.

Proceeding to 416, a determination is made whether the codeword is to be punctured. When it is decided to puncture the codeword, the codeword may be punctured, at 418. For example, in FIG. 1, the codeword puncturer 124 may puncture each of the codewords 160 and 162 to generate the punctured codewords 170 and 172, respectively. Alternatively, at least one of the codewords 160, 162 may be punctured, removing at least one of the metadata bits from the punctured codeword. As an illustrative example, the codeword 162 may be punctured, removing at least one of the metadata bits 144, while the codeword 160 is not punctured. The decision of whether to remove at least one metadata bit from a codeword may depend on a location at which the codeword is to be stored within a word line. For example, the first codeword 160 may be selectively punctured based on comparing a first location, at which the codeword 160 is to be stored, to a predetermined location within the word line 108 of the memory 104. As an additional example, the second codeword 162 may be selectively punctured based on comparing a second location, at which the codeword 162 is to be stored, to another predetermined location within the word line 108 of the memory 104.

Moving to 420, the punctured codeword may be stored along with the common seed in the memory storage device. For example, in FIG. 1 the punctured codewords 170 and 172 are stored, along with the metadata bits 144, in the memory 104 of the data storage device 102. The metadata bits 144 may be associated with both of the punctured codewords 170 and 172. In an illustrative example, the metadata bits are stored in the memory storage device and the metadata bits are not stored as part of any codeword.

Returning to 416, if the codeword is not punctured, the unpunctured codeword may be stored in the memory storage device. For example, four codewords may be stored at a word line and may be scrambled based on a common seed. Each codeword may be encoded with the seed as an extended codeword, and one or more of the codewords may not be punctured. Thus, the seed may be stored with the unpunctured codewords but removed from the punctured codewords.

An advantage to the method depicted in FIG. 4 is that a common scrambling seed that is used to scramble multiple data words can be stored in a single instance, resulting in a saving of memory space.

In a particular example, the method of storing data may include:

Get data from a host;

Determine a location within a wordline (WL) to which the encoded data is programmed;

Get a common seed and apply a predefined transformation to the seed according to the location;

Generate a scrambling pattern by using the transformed seed to generate the scrambling pattern;

Scramble the data received from the host using the scrambling pattern;

Concatenate the common seed to the scrambled word to generate an extended word;

Encode (with ECC) the extended word to generate a codeword;

Determine whether the codeword is to be punctured; and

Puncture the codeword where the common seed is included.

Figure 5:
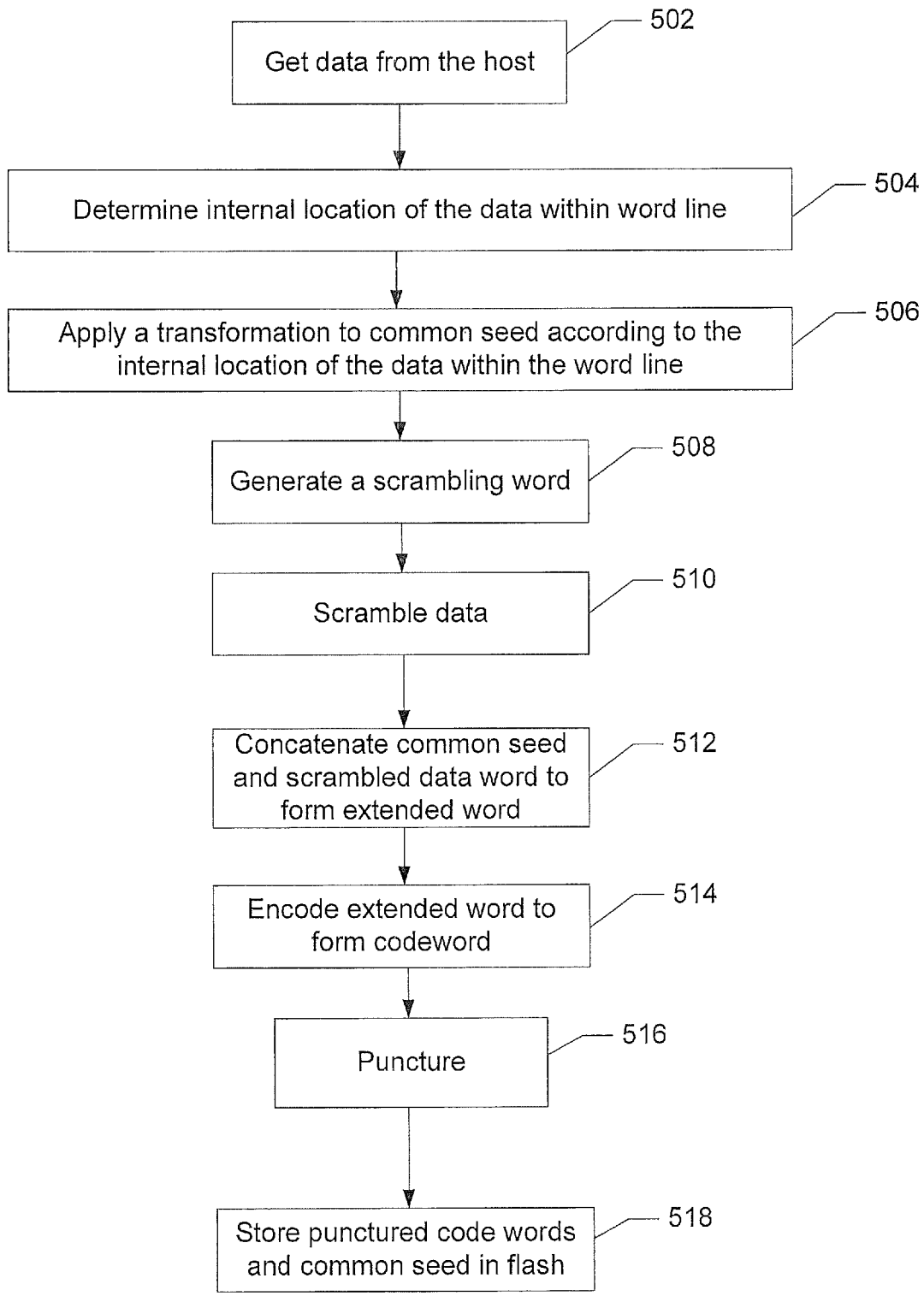
FIG. 5 is a flow chart depicting a second embodiment of a method of storing data in a memory.

FIG. 5 depicts another method of storing data in a memory storage device. At 502, data may be retrieved from a host. For example, in FIG. 1, the data storage device 102 may retrieve data from the host device 130.

Continuing to 504, an internal location of the data within a word line may be determined. For example, referring to FIG. 1, one of a plurality of internal locations of a word line 108 may be determined within the memory 104 of the data storage device 102.

Advancing to 506, a transformation may be applied to a common seed according to the internal location of the data within the word line. For example, referring to FIG. 1, a transformation may be applied to the set of metadata bits 144. The transformation may be dependent upon an internal location of data to be stored in a word line such as the word line 108 of the memory 104. In a particular example, the transformation may include a bit shift or rotation, such as a zero bit shift for a first location, a one bit shift for a second location, or another transformation.

In an example, the common seed can be generated within the host and transferred to the controller together with each page, or the common seed can be generated by the controller. When the common seed is generated by the controller, in a particular illustrative example the common seed is not correlated with other word lines so that data on the same bit line appears randomly and uniformly distributed.

Moving to 508, a scrambling word may be generated by using the transformed seed as the scrambling seed. For example, the scrambling word may be generated using a seed such as the set of metadata bits 144 of FIG. 1 at a linear feedback shift register.

Proceeding to 510, the data may be scrambled according to the scrambling word. For example, in FIG. 1, the scrambler 126 may scramble the data using the scrambling word. The scrambler 126 may apply a bitwise XOR operation to scramble the data.

Continuing to 512, the common seed may be concatenated with the scrambled data word to form an extended word. For example, in FIG. 1, the common seed may be the set of metadata bits 144. The first data word 140 may be concatenated with the set of metadata bits 144 to form the first extended data word 150, and the second data word 142 may be concatenated with the set of metadata bits 144 to form the second extended data word 152.

Moving to 514, the extended word may be encoded to form a codeword. For example, in FIG. 1, the extended data words 150 and 152 may be encoded by the ECC encoder 122 to form the codewords 160 and 162, respectively.

Proceeding to 516, the codeword may be punctured, removing the common seed from each of the codewords. For example, in FIG. 1, the codeword puncturer 124 may puncture each of the codewords 160 and 162 to generate punctured codewords 170 and 172, respectively. Alternatively, each codeword may be punctured to generate punctured codewords, such as the punctured codewords 332, as shown in FIG. 3.

Advancing to 518, the punctured codewords and one instance of the common seed may be stored in the memory storage device. For example, in FIG. 1 the punctured codewords 170 and 172 are stored, along with the possibly transformed (i.e., encoded) metadata bits 144, in the memory 104 of the data storage device 102. In an example, the data storage device 102 may be a flash memory device.

In the method depicted in FIG. 5, the common seed may be handled separately from each of the multiple words while all the codewords are punctured, i.e., the common seed may be removed from the codewords before they are saved to the memory device. An advantage to the method depicted in FIG. 5 is that metadata bits that are associated with multiple data words can be stored in a single instance, resulting in a saving of memory space.

Figure 6:
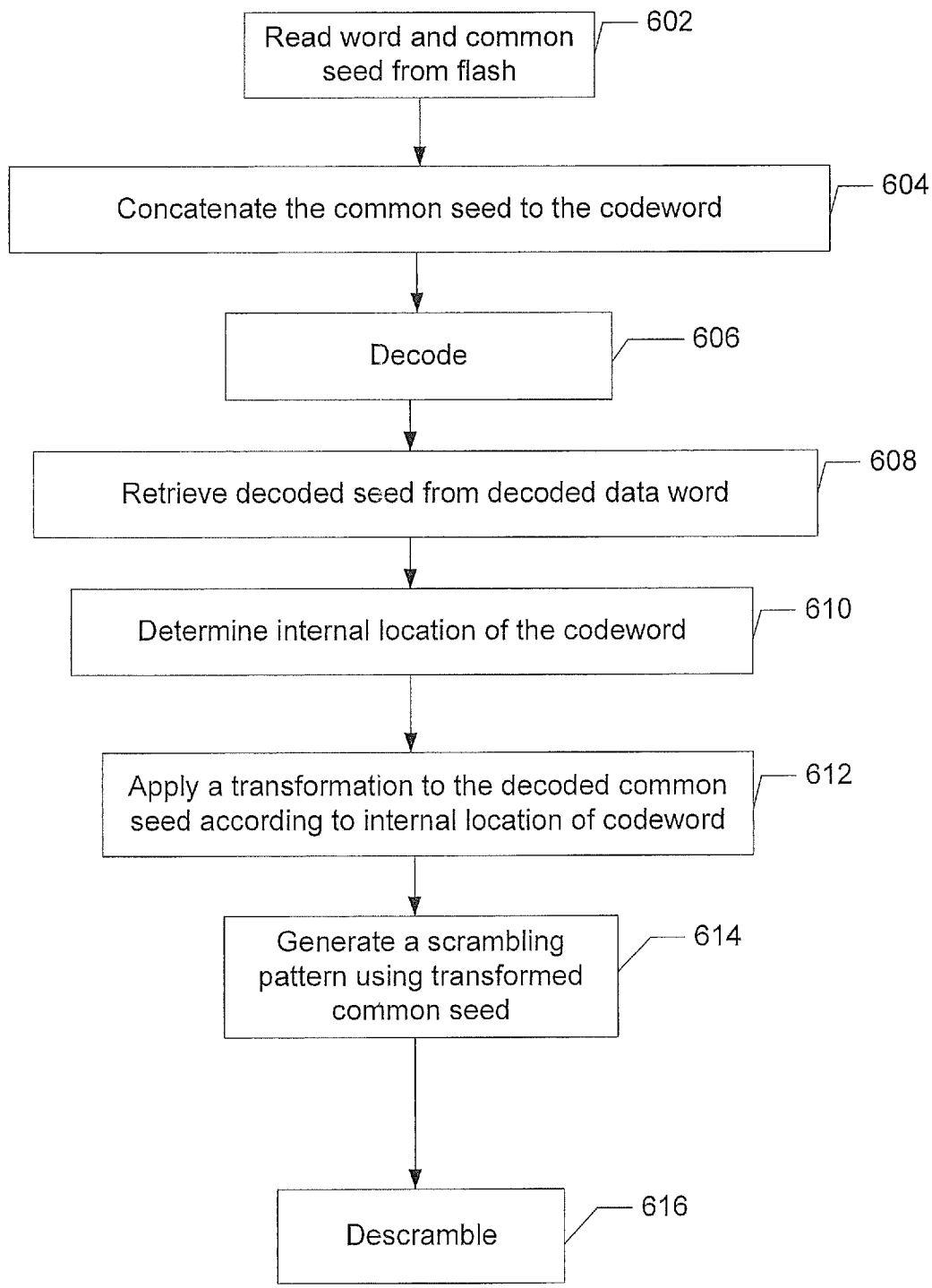
FIG. 6 is a flow chart depicting a first embodiment of a method of retrieving encoded data from a memory.

An implementation of a method depicted in FIG. 6 includes reading a punctured codeword from a memory, such as a flash memory, together with the set of metadata bits that are associated with each of multiple codewords. In a particular example, at least one bit of a representation of the set of metadata bits is retrieved from one codeword representation stored at the memory and at least one other bit of a representation of the set of metadata bits is retrieved from another codeword representation stored at the memory. The representation of the set of metadata bits may be concatenated with each punctured codeword to generate a codeword. This codeword may be decoded by an ECC decoder. In a particular illustrative example, the set of metadata bits is a seed for descrambling and the decoded codeword is XOR-ed with a scrambling pattern generated by a pseudo-random generator fed by a transformation of the seed according to a location of the codeword within a page or word line (WL) of the memory.

FIG. 6 depicts a flow chart of the method of retrieving data from a data storage device, such as a flash memory device. At 602, a word and a common seed are read from the memory storage device. For example, in FIG. 2, codeword representations 270 and 272 are read from the memory 204 of the data storage device 202. In a particular example, at least a first bit of the set of metadata bits is retrieved from a first codeword representation stored at the memory and at least a second bit of the set of metadata bits is retrieved from a second codeword representation stored at the memory. In an illustrative example shown at 332 of FIG. 3, a first portion 340 of metadata bits is stored at the codeword representation 334, a second portion 342 of the metadata bits are stored at the codeword representation 336, and a third portion 344 of the metadata bits is stored at the codeword representation 338. The portions 340, 342, and 344 are retrieved to for in the set of metadata bits 310.

Continuing to 604, the common seed may be combined with a codeword (or a representation of a codeword that may contain one or more errors), to form an unpunctured codeword. For example, in FIG. 2, the combiner 224 may combine the metadata representation 246 with each of the codeword representations 270 and 272 to produce the extended codeword representations 260 and 262, respectively.

Advancing to 606, the unpunctured codeword May be decoded. For example, in FIG. 2, the ECC decoder 222 may decode extended codeword representations, such as the extended codeword representations 260 and 262, using an error correction encoding (ECC) to generate decoded extended data words, such as the decoded extended data words 250 and 252.

Moving to 608, a decoded seed may be retrieved from the decoded codeword. For example, in FIG. 2, the data word parser 220 may parse the decoded extended data words to generate decoded data words, such as the decoded data words 240 and 242 and may retrieve the decoded metadata bits 248.

Proceeding to 610, an internal location of the codeword may be determined. For example, in FIG. 2, the locations of the first codeword representation and the second codeword representation within the word line 208 of the memory 204 may be determined.

Continuing to 612, a transformation may be applied to the decoded common seed according to the internal location of the codeword. For example, in FIG. 2, a transformation, such as a bit shift or rotation, may be applied to the metadata bits 248 according to the location of the first codeword representation or the second codeword representation.

Advancing to 614, a scrambling pattern may be generated using the transformed common seed. For example, in FIG. 2, the descrambler 226 may generate a scrambling pattern based on the metadata bits 248. Moving to 616, the decoded data word may be descrambled according to the scrambling pattern. For example, in FIG. 2, the descrambler 226 may descramble each of decoded data words 240 and 242 according to the generated scrambling pattern.

An advantage to the method depicted in FIG. 6 is that metadata bits associated with each of multiple codewords can be retrieved in a single instance, resulting in a saving of memory space. In addition, decoding and descrambling using a single ECC decode operation can be accomplished in a shorter time period than when the seed and the codeword are decoded separately. Moreover, as a single ECC engine is used, controller complexity is reduced. Additionally, as both the data and seed are protected using a single ECC codeword, less redundancy may be used to achieve the same error correction capability, resulting in more efficient use of storage space.

Figure 7:
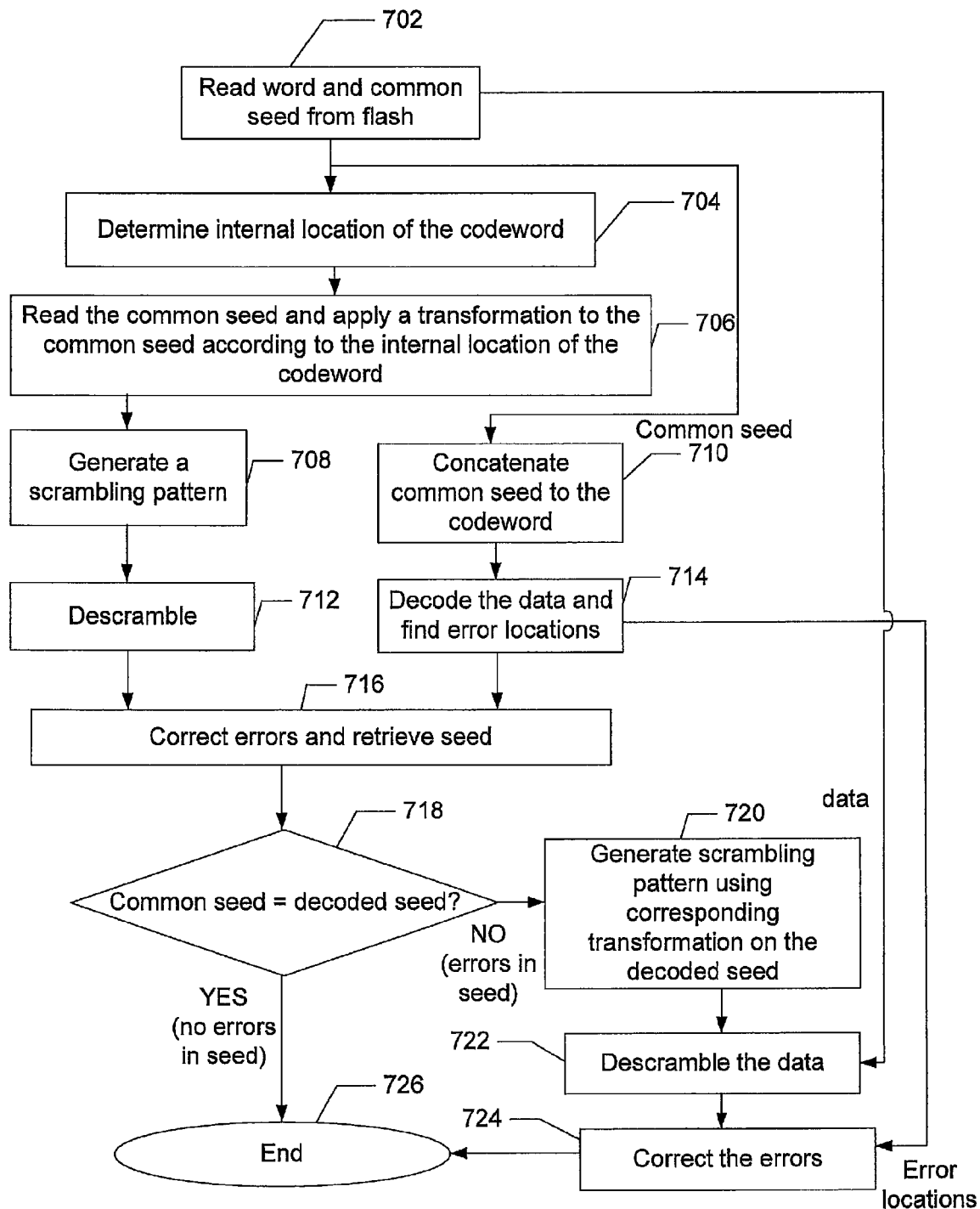
FIG. 7 is a flow chart depicting a second embodiment of a method of retrieving encoded data from a memory.

FIG. 7 depicts an alternate method of retrieving data from a memory storage device. At 702, a word and a common seed are read from the memory storage device. For example, in FIG. 2, the controller 206 reads the first codeword representation 270, the second data representation 272, and the metadata representation 246 from the memory 204.

Continuing to 704, an internal location of the codeword within a word line may be determined. For example, in FIG. 2, the first location of the word line 208 can be determined to be a first storage location storing the first codeword representation 270, and the second location of the word line 208 can be determined to be a second storage location storing the second codeword representation 272 of the word line 208.

Advancing to 706, the common seed may be read and a transformation may be applied to the common seed according to the internal location of the codeword. Moving to 708, a scrambling word may be generated using the transformed seed. Proceeding to 712, the data may be descrambled according to the scrambling word.

Concurrently with generating the scrambling word and descrambling, at 710, the common seed may be concatenated to the codeword and the data may be decoded and error locations may be found, at 714. For example, in FIG. 2, the combiner 224 may concatenate the metadata bits 248 to each of the codeword representations 270 and 272 to generate the extended codeword representations 260 and 262. The ECC decoder 222 may decode the extended codeword representations 260 and 262 and find error locations.

Proceeding to 716, errors are corrected and a decoded seed, such as an error-corrected common seed, may be retrieved from at least one of multiple decoded data words. In a particular example, the decoded seed is a portion of at least one of the multiple decoded data words. For example, in FIG. 2, the ECC decoder 222 may correct the errors in extended codeword representations 260 and 262 and may retrieve the metadata bits 246.

Continuing to 718, a determination is made whether the common seed that was used to descramble the data word matches the decoded seed, at 718. If the common seed is equal to the decoded seed then there are no errors in the seed and the method ends, at 726. If there are errors in the common seed, a scrambling pattern may be generated by applying a corresponding transformation to the decoded seed, at 720.

Continuing to 722, the data may be descrambled according to the scrambling pattern that has been generated using the transformed decoded seed. Advancing to 724, the errors are corrected using the error locations determined at 714. The method ends at 726.

An advantage to the method depicted in FIG. 7 is that descrambling and decoding the data can proceed in parallel and can result in a saving of time when no errors occur in the seed. Another advantage to the method depicted in FIG. 7 is that metadata bits associated with each of multiple codewords can be retrieved in a single instance, resulting in a saving of memory space.

A particular illustrative example of a method to retrieve stored data includes use of binary Bose-Chaudhuri-Hocquenghem codes (BCH) codes. The particular illustrative method can include finding error locations and flipping values of bits at these error locations or may use other implementations that find errors and correct the data by applying an XOR operation between the data and the error value. In binary BCH code, the error location may be sufficient to perform an error correction since binary BCH code is a binary code, and correction is equivalent to flipping the bits in designated locations. In the method depicted in FIG. 7, the descrambling operation 712 and the decoding operation 714 can be applied in parallel during the transfer operation from the memory to the controller.

Applying the descrambling operation 712 and the decoding operation 714 in parallel may reduce a read delay, assuming a high probability that bits, including the common seed, are correctly retrieved from the memory. For example, if the bit error rate (BER) is 0.1% and the common seed is 32 bits, then there is an approximately 97% probability that the common seed retrieved from the memory will have no errors.

When the ECC code is a binary BCH code, descrambling at 720-722 and correcting at 724 in FIG. 7 can be exchanged, since error correction with respect to the binary BCH code is equivalent to bit flipping regardless of the bit value. In a particular example, the scrambling is a binary XOR operation and scrambling and descrambling operations are inverses of one another. In this case, it may be sufficient to repeat the first scrambling and then descramble with the correct seed. Such an implementation is illustrated in FIG. 8.

Figure 8:
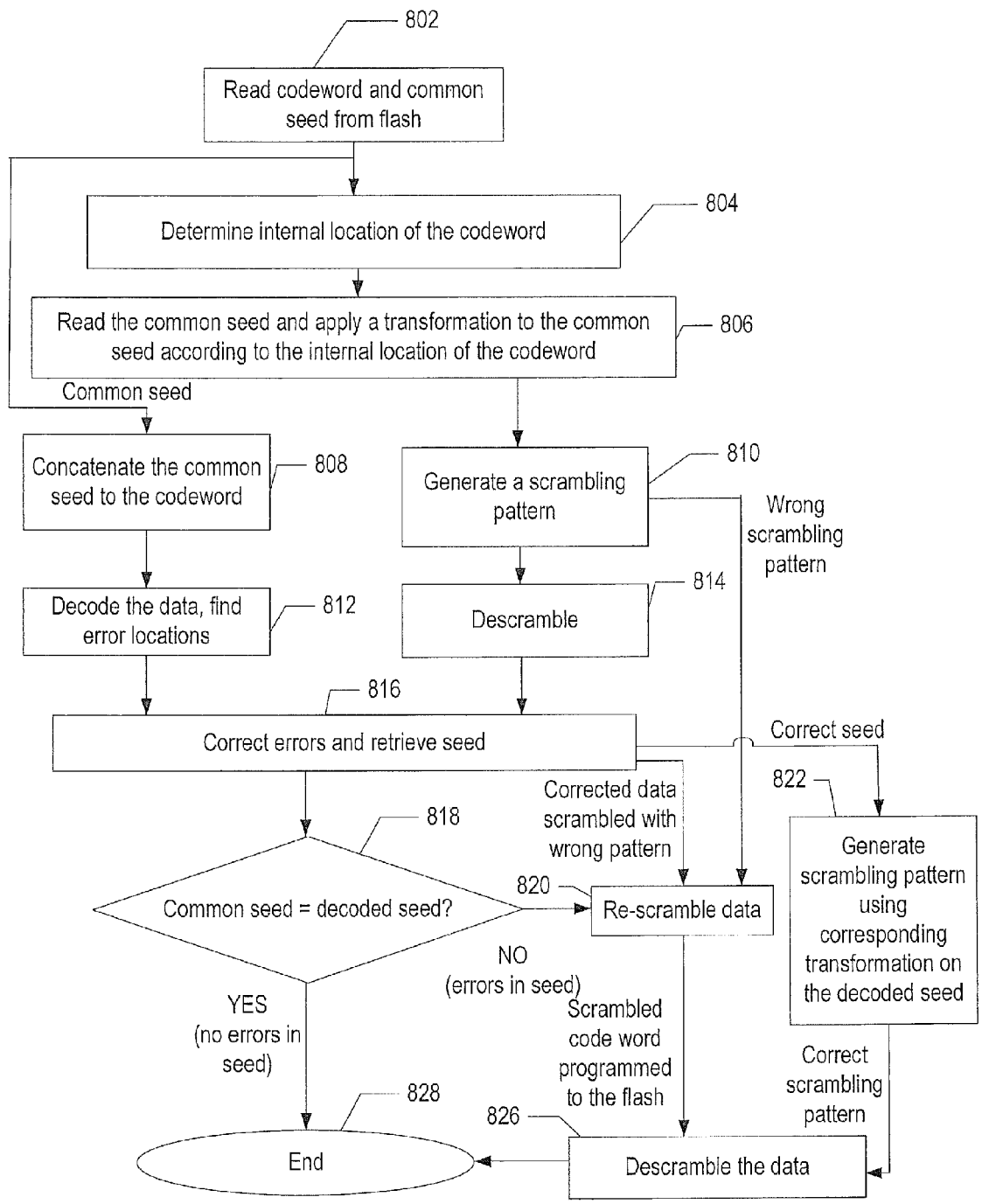
FIG. 8 is a flow chart depicting a third embodiment of a method of retrieving encoded data from a memory.

FIG. 8 depicts another method of retrieving data from a memory storage device, such as a flash memory device. At 802, a codeword and a common seed are read from the memory storage device. For example, in FIG. 2, codeword representations 270 and 272 can be read from the memory 204 of the data storage device 202.

Continuing to 804, an internal location of the codeword within a word line may be determined. For example, in FIG. 2, the first location of the word line 208 can be determined to be a first storage location storing the first codeword representation 270, and the second location of the word line 208 can be determined to be a second storage location storing the second codeword representation 272 of the word line 208.

Advancing to 806, the common seed may be read and a transformation to the common seed may be applied according to the internal location of the codeword in the word line. Moving to 808, the common seed may be concatenated to the codeword to form an unpunctured codeword. For example, in FIG. 2, the combiner 224 may combine the metadata representation 246 with each of the codeword representations 270 and 272 to produce the extended codeword representations 260 and 262, respectively.

Proceeding to 812, the data may be decoded and error locations are found. For example, in FIG. 2, the ECC decoder 222 may decode extended codeword representations, such as extended codeword representations 260 and 262, using an error correction code (ECC) to generate decoded extended data words, such as decoded extended data words 250 and 252. The ECC decoder 222 may locate error locations in the data within the extended codeword representations 260 and 262.

Concurrently with concatenating the data and decoding the data, a scrambling pattern may be generated, at 810. For example, in FIG. 2 the descrambler 226 may generate a descrambling pattern based on the metadata bits 248.

Proceeding to 814, the data may be descrambled according to the scrambling pattern. For example, in FIG. 2, the descrambler 226 may descramble each of the decoded data words 240 and 242.

Continuing to 816, the errors are corrected and a decoded seed, such as an error-corrected common seed, may be retrieved from at least one of multiple decoded data words. In a particular example, the decoded seed is a portion of at least one of multiple decoded data words. For example, in FIG. 2, the ECC decoder 222 may flip bits of the first data 240 and the second data 242 after descrambling (at 814), using the determined error locations (from 814).

Moving to 818, a determination is made whether the common seed used to scramble the data matches the decoded seed. If it is determined, at 818, that there are no errors in the seed, the method ends at 828. If there are errors in the common seed, at 820, the data may be re-scrambled with the incorrect (i.e. wrong) scrambling pattern that was generated at 810. Concurrently with re-scrambling the data, a second scrambling pattern may be generated using a corresponding transformation on the decoded seed, i.e., on the decoded metadata bits, at 822. The second scrambling pattern generated at 822 will be a correct scrambling pattern based on an error-corrected seed. The re-scrambled data (from 820) may be descrambled by performing a second scrambling transformation to generate one or more second descrambled data words according to the second scrambling pattern, at 826. The method ends at 828.

When the ECC code is a binary BCH code, which may be corrected by flipping the bits in the designated error locations, and the scrambling is done by a XOR operation with a scrambling word re-scrambling the data at 820 with the same scrambling word used at 814 results in the original data (prior to de-scrambling), but with the bits in the error locations flipped. Therefore de-scrambling the data at 826 in FIG. 8 can with the correct scrambling word will result in the original data word. Moreover, since XOR is a commutative operation, rescrambling at 820 and descrambling at 826 may be exchanged.

An advantage of the method depicted in FIG. 8 is that descrambling and decoding the data can proceed in parallel and can result in a saving of time. Another advantage to the method depicted in FIG. 8 is that metadata bits associated with each of multiple codewords can be retrieved in a single instance, resulting in a saving of memory space.

Figure 9:
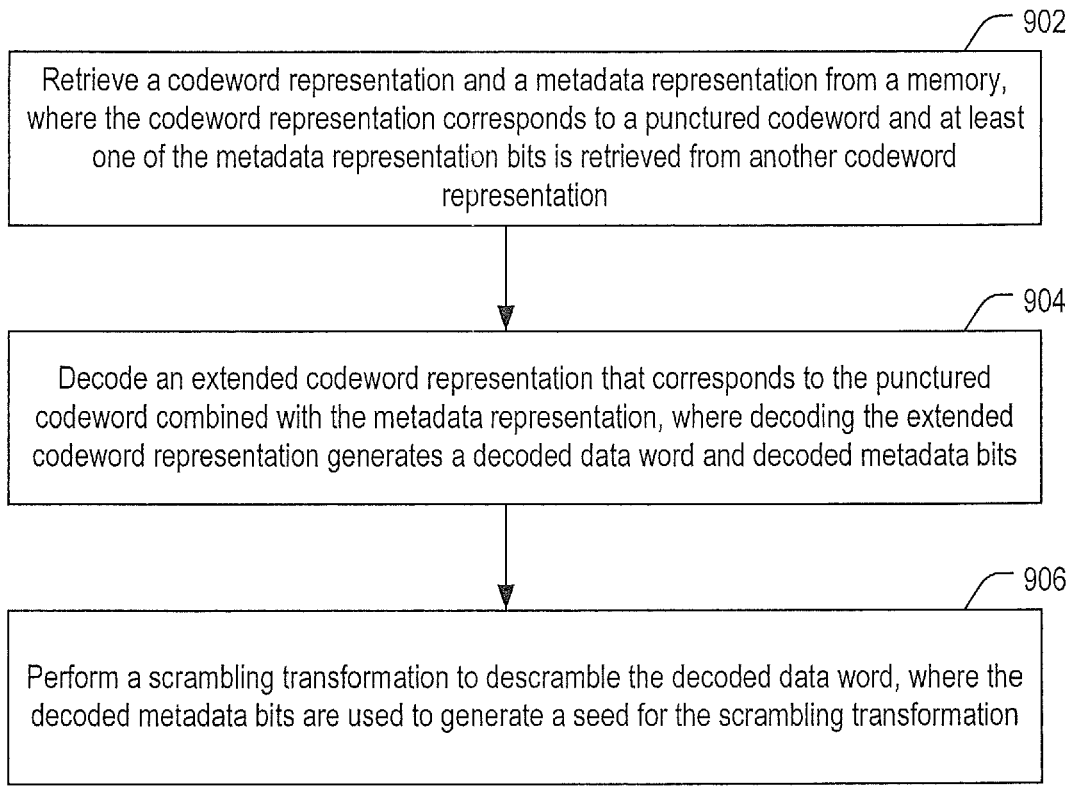
FIG. 9 is a flow chart depicting a fourth embodiment of a method of retrieving encoded data from a memory.

FIG. 9 depicts a method of retrieving data from a memory storage device. At 902, a codeword representation and a metadata representation are retrieved from a memory. The codeword representation corresponds to a punctured codeword, and at least one bit of the metadata representation may be retrieved from another codeword representation.

Continuing to 904, an extended codeword corresponding to the punctured codeword combined with decoded metadata bits may be decoded. Decoding the extended codeword generates a decoded data word and decoded metadata bits. In one implementation, a metadata representation is decoded, i.e., transformed, by decoding the metadata representation using an error correction code. In a particular illustrative example, the metadata representation is transformed using an identity transformation, where the set of transformed metadata bits is identical to the set of metadata bits.

Advancing to 906, a scrambling transformation may be performed to descramble the decoded data word. The decoded metadata bits are used to generate a seed for the scrambling transformation. In one implementation of the method, the decoded metadata bits include a seed.

An implementation of the method of decoding data includes reading a punctured codeword from the memory together with the set of metadata bits that are associated with each of multiple codewords. In a particular example, the set of metadata bits constitute a common seed. The set of metadata bits is concatenated with the punctured codeword to generate a codeword that may be decoded by an ECC decoder. When the set of metadata bits is a seed for scrambling, the decoded data word may be XOR-ed with a scrambling pattern generated by a pseudo-random generator that is fed by a transformation of the seed according to a location of the codeword within a page or a word line (WL) of the flash memory.

The methods and apparatus described herein can be applied in cases where a set of metadata bits is associated with each of multiple data words and where storing the set of metadata bits together with each of multiple words, or in a dedicated codeword by itself, is not desired. The methods and apparatus described herein can be applied to both encoding and decoding.

Although various components depicted herein are illustrated as block components and described in general terms, such components may include one or more microprocessors, state machines, or other circuits configured to enable a data storage device, such as data storage device 102 or the data storage device 202, to perform the particular functions attributed to such components, or any combination thereof.

For example, the data word extender 120 may be implemented using dedicated circuitry or a microprocessor or microcontroller programmed to concatenate, append, or otherwise combine the set of metadata bits 144 to each of the data words 140, 142. As another example, the codeword puncturer 124 may be implemented using dedicated circuitry or a microprocessor or microcontroller programmed to selectively remove one or more of the set of metadata bits 144 from the codewords 160, 162. In a particular embodiment, the data word extender 120, the codeword puncturer 124, or a combination thereof, includes executable instructions that are executed by a processor and the instructions are stored at the memory 104. Alternatively, or in addition, executable instructions that are executed by a processor that may be included in the controller 106 may be stored at a separate memory location that is not part of the memory 104, such as at a read-only memory (ROM) of the controller 106 (not shown).

In a particular embodiment, the data storage device 102 or 202 can be a portable device configured to be selectively coupled to one or more external devices. However, in other embodiments, the data storage device 102 or 202 may be attached or embedded within one or more host devices, such as within a housing of a portable communication device. For example, the data storage device 102 may be within a packaged apparatus, such as a wireless telephone, a personal digital assistant (PDA), gaming device or console, a portable navigation device, or other device that uses internal non-volatile memory. In a particular embodiment, the data storage device 102 includes a non-volatile memory, such as a flash memory (e.g., NAND, NOR, Multi-Level Cell (MLC), Divided bit-line NOR (DINOR), AND, high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or another type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Accordingly, the disclosure and the figures are to be regarded as illustrative rather than restrictive.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of storing multiple data words, the method comprising:
   in a data storage device that includes a non-volatile memory, performing:
      combining metadata bits comprising a scrambling seed with each data word of a plurality of data words to generate a plurality of extended data words, the plurality of extended data words including a first extended data word and a second extended data word;
      encoding each of the plurality of extended data words to generate a plurality of error correction code (ECC) codewords, wherein encoding the first extended data word generates first parity bits configured to enable error correction of the metadata bits in the first extended data word, and wherein encoding the second extended data word generates second parity bits configured to enable error correction of the metadata bits in the second extended data word;
      puncturing each of the plurality of ECC codewords to generate a plurality of punctured codewords, wherein in each of the punctured codewords the metadata bits are removed; and
   storing the plurality of punctured codewords and data that represents the metadata bits at a storage device.

2. The method of claim 1, further comprising applying a transformation to at least one of the plurality of extended data words, wherein the transformation is a function of the scrambling seed.

3. The method of claim 2, wherein the transformation includes a scrambling transformation.

4. The method of claim 1, further comprising encoding the metadata bits at an ECC encoder that is dedicated to encoding metadata, wherein the data that represents the metadata bits includes an ECC encoded version of the metadata bits.

5. The method of claim 1, further comprising correcting errors in the scrambling seed in the metadata bits in the first extended data word based on the first parity bits or correcting errors in the scrambling seed in the metadata bits in the second extended data word based on the second parity bits.

6. A method of reading multiple data words, the method comprising:
   in a data storage device that includes a non-volatile memory, performing:
      for each of the multiple data words, reading from the non-volatile memory a corresponding codeword representation including a first codeword representation corresponding to a first data word and a second codeword representation corresponding to a second data word;
      reading from the non-volatile memory a representation of a scrambling seed;
      transforming the representation of the scrambling seed to generate a transformed representation of the scrambling seed;
      combining the transformed representation of the scrambling seed with each of the multiple codeword representations to generate multiple extended error correction code (ECC) codeword representations including a first extended ECC codeword representation including the transformed re representation of the scrambling seed and the first codeword representation and a second extended ECC codeword representation including the transformed representation of the scrambling seed and the second codeword representation; and
      decoding each of the multiple extended ECC codeword representations to generate multiple decoded data words.

7. The method of claim 6, wherein the transforming of the representation of the scrambling seed includes decoding the representation of the scrambling seed using an error correction code.

8. The method of claim 6, wherein the transforming of the representation of the scrambling seed employs an identity transformation, and wherein the transformed representation of the scrambling seed is identical to the representation of the scrambling seed.

9. The method of claim 6, wherein the transformed representation of the scrambling seed includes a seed that is used for descrambling each of the multiple decoded data words.

10. The method of claim 6, wherein the decoding comprises:
   decoding each of the multiple extended ECC codeword representations to generate error locations in the multiple extended ECC codeword representations;

descrambling the multiple extended ECC codeword representations to generate multiple descrambled codeword representations, wherein the transformed representation of the scrambling seed is used as a seed for the descrambling; and correcting the multiple descrambled codeword representations to generate the multiple decoded data words by effecting corrections at the error locations.

11. The method of claim 10, further comprising:
comparing the transformed representation of the scrambling seed to a portion of at least one of the multiple decoded data words; and
in response to a discrepancy determined by comparing the transformed representation of the scrambling seed and the portion of at least one of the multiple decoded data words, repeating the descrambling and correcting, using the portion as the seed for the descrambling.

12. A data storage device, comprising:
a non-volatile memory; and
a controller coupled to the non-volatile memory, wherein the controller is configured to:
combine a scrambling seed with each of a plurality of data words including a first data word and a second data word to generate a plurality of extended data words including a first extended data word that includes the scrambling seed and the first data word and a second extended data word that includes the scrambling seed and the second data word;
encode each of the plurality of extended data words to generate a plurality of error correction code (ECC) codewords including a first ECC codeword corresponding to the first extended data word and a second ECC codeword corresponding to the second extended data word;
puncture each codeword of the plurality of ECC codewords to generate a plurality of punctured codewords by removing the scrambling seed from each codeword, wherein the plurality of punctured codewords includes a first punctured codeword generated by removing the scrambling seed from the first ECC codeword and a second punctured codeword generated by removing the scrambling seed from the second ECC codeword; and
store the plurality of punctured codewords and store data that represents the scrambling seed into the non-volatile memory.

13. The data storage device of claim 12, wherein the controller is operative to apply a particular transformation to at least one of the plurality of extended data words, and wherein the particular transformation is a function of the scrambling seed.

14. The data storage device of claim 13, wherein the particular transformation comprises a scrambling transformation.

15. The data storage device of claim 14, wherein the scrambling seed includes a seed for the scrambling transformation.

16. The data storage device of claim 12, wherein the controller is operative to:
transform the scrambling seed to generate a transformed scrambling seed; and
wherein the data that represents the scrambling seed includes the transformed scrambling seed.

17. The data storage device of claim 16, wherein transforming the scrambling seed includes encoding the scrambling seed with an error correction code.

18. The data storage device of claim 16, wherein the scrambling seed is transformed by employing an identity transformation, and wherein the transformed scrambling seed is identical to the scrambling seed.

19. A data storage device, comprising:
a non-volatile memory; and
a controller coupled to the non-volatile memory, wherein the controller is configured to:
read a codeword representation of each of a plurality of codewords from the non-volatile memory;
read a representation of a scrambling seed from the non-volatile memory;
transform the representation of the scrambling seed to generate a transformed representation of the scrambling seed;
combine the transformed representation of the scrambling seed with each of the codeword representations to generate a plurality of extended error correction code (ECC) codeword representations, the plurality of extended ECC codeword representations including a first ECC codeword representation including the transformed representation of the scrambling seed and the first codeword representation and a second ECC codeword representation including the transformed representation of the scrambling seed and the second codeword representation; and
decode each of the plurality of extended ECC codeword representations to generate a plurality of decoded data words and to generate a decoded scrambling seed.

20. The data storage device of claim 19, wherein the controller is configured to transform the representation of the scrambling seed by decoding the representation of the scrambling seed using an error correction code.

21. The data storage device of claim 19, wherein the transformation of the representation of the scrambling seed includes an identity transformation, and wherein the transformed representation of the scrambling seed is identical to the representation of the scrambling seed.

22. The data storage device of claim 19, wherein the transformed representation of the scrambling seed includes a seed that is usable to descramble each of the plurality of decoded data words.

23. The data storage device of claim 19, wherein each of the plurality of extended ECC codeword representations is decoded by:
determining error locations in the plurality of extended ECC codeword representations;
descrambling the plurality of extended ECC codeword representations to generate a plurality of descrambled codeword representations, wherein the transformed representation of the scrambling seed includes a seed for the descrambling; and
correcting the plurality of descrambled codeword representations at error locations of the descrambled codeword representations corresponding to the error locations in the plurality of extended ECC codeword representations.

24. The data storage device of claim 23, wherein the controller is configured to:
compare the transformed representation of the scrambling seed to a portion of at least one of the plurality of decoded data words; and
in response to a discrepancy determined by the comparison of the transformed representation of the scrambling seed to the portion of the at least one of the plurality of decoded data words, repeat the descrambling and correcting, wherein the descrambling is effected using the portion as a corrected seed.

25. A method comprising:
in a data storage device that includes a non-volatile memory, performing:
retrieving a first data word representation and a representation of a scrambling seed from the non-volatile memory, and wherein the first data word representation corresponds to a first punctured codeword, and wherein the representation of the scrambling seed is retrieved from a second data word representation;
generating a first extended error correction coding (ECC) codeword by combining the first punctured codeword with the representation of the scrambling seed; and
decoding the first extended ECC codeword to generate a first decoded data word and a decoded scrambling seed.

26. The method of claim 25, further comprising performing a scrambling transformation to descramble the first decoded data word, wherein the decoded scrambling seed is used to generate a seed for the scrambling transformation.

27. The method of claim 26, wherein the decoded scrambling seed is modified according to a transformation based on a location of the second data word representation within a word line of the non-volatile memory.

28. The method of claim 27, further comprising generating a scrambling pattern using the modified decoded scrambling seed as a scrambling seed.

29. The method of claim 25, wherein decoding the first extended ECC codeword includes identifying error location information of the first extended ECC codeword, and further comprising:
performing a scrambling transformation to descramble at least a portion of the first data word representation to generate a first descrambled codeword, wherein the representation of the scrambling seed is used to generate a seed for the scrambling transformation; and
correcting errors within the first descrambled codeword according to the error location information to generate a first corrected data word.

30. The method of claim 29, further comprising, in response to detecting that the representation of the scrambling seed does not match the decoded scrambling seed:
performing a second scrambling transformation to descramble the portion of the first data word representation to generate a second descrambled codeword, wherein the decoded scrambling seed is used to generate a second scrambling seed for the second scrambling transformation; and
correcting errors within the second descrambled codeword according to the error location information.

31. The method of claim 29, further comprising, in response to detecting that the representation of the scrambling seed does not match the decoded scrambling seed:
performing a second scrambling transformation to re-scramble the first corrected data word using the representation of the scrambling seed; and
performing a third scrambling transformation to descramble the re-scrambled first corrected data word, wherein the decoded scrambling seed is used to generate a second seed for the third scrambling transformation.

32. A method comprising:
in a data storage device that includes a non-volatile memory, performing:
encoding a first extended data word to generate a first error correction code (ECC) codeword, the first extended data word corresponding to a first data word combined with metadata bits, wherein encoding the first extended data word generates first parity bits configured to enable error correction of the metadata bits;
encoding a second extended data word to generate a second ECC codeword, the second extended data word corresponding to a second data word combined with the metadata bits, wherein encoding the second extended data word generates second parity bits configured to enable error correction of the metadata bits in the second extended data word; and
prior to storing the first ECC codeword and the second ECC codeword, selectively puncturing at least one of the first ECC codeword or the second ECC codeword by removing at least one of the metadata bits.

33. The method of claim 32, wherein the first ECC codeword is stored as an unpunctured codeword, and wherein the second ECC codeword is stored as a punctured codeword that does not include any of the metadata bits.

34. The method of claim 32, further comprising:
receiving data corresponding to the first data word and the second data word from a host device; and
determining a first location within a word line of the non-volatile memory corresponding to storing the first data word and a second location within the word line corresponding to storing the second data word,
wherein selectively puncturing at least one of the first ECC codeword or the second ECC codeword includes determining whether to remove at least one of the metadata bits based on comparing the first location and the second location to a location within the word line.

* * * * *